United States Patent [19]

Clark, Jr. et al.

[11] Patent Number: 4,967,250
[45] Date of Patent: Oct. 30, 1990

[54] CHARGE-COUPLED DEVICE WITH FOCUSED ION BEAM FABRICATION

[75] Inventors: William M. Clark, Jr., Thousand Oaks; Robert H. Walden, Westlake Village; Mark W. Utlaut, Saugus, both of Calif.

[73] Assignee: Hughes Aircraft Company, Los Angeles, Calif.

[21] Appl. No.: 426,481

[22] Filed: Oct. 23, 1989

Related U.S. Application Data

[63] Continuation of Ser. No. 46,019, May 5, 1987, abandoned.

[51] Int. Cl.$^5$ .................. H01L 29/78; G11C 19/28
[52] U.S. Cl. .................................. 357/24; 357/91; 377/58
[58] Field of Search .............. 357/24, 91; 377/57-63

[56] References Cited

U.S. PATENT DOCUMENTS

| | | | |
|---|---|---|---|
| 3,728,161 | 4/1973 | Moline . | |
| 3,789,267 | 1/1974 | Krambeck et al. | 357/24 |
| 3,796,932 | 3/1974 | Amelio et al. | 357/24 |
| 3,873,371 | 3/1975 | Wolf | 357/24 |
| 4,012,759 | 3/1977 | Esser | 357/24 |
| 4,028,716 | 6/1977 | van Santen et al. | 357/24 |
| 4,051,505 | 9/1977 | Krambeck et al. | 357/24 |
| 4,607,429 | 8/1986 | Kosonocky | 357/24 |
| 4,667,213 | 5/1987 | Kosonocky | 357/24 |
| 4,673,963 | 6/1987 | Hynecek | 357/24 |

FOREIGN PATENT DOCUMENTS

61-248554 11/1986 Japan .

OTHER PUBLICATIONS

Microelectronic Engineering, vol. 4, No. 4, 1986 (North-Holland, Amsterdam, NL), MIJ Beale et al.: "Focused Ion Beams for Lithography and Direct Doping in VLSI Device Fabrication," pp. 233-249, See Paragraphs 2,4.
Journal of Vacuum Science and Technology, vol. 19, No. 1, May-Jun. 1981, (New York, US), V. Wang et al.: "A Mass-Separating Focused-Ion-Beam System for Maskless Ion Implantation," See Pages 1158-1163.
Reuss et al., "Vertical NPN Transistors by Maskless Boron Implantation" J. Vacuum Science and Technology vol. B3 (Jan./Feb. 1985), pp. 62-66.

*Primary Examiner*—Gene M. Munson
*Attorney, Agent, or Firm*—Paul M. Coble; Wanda K. Denson-Low

[57] ABSTRACT

A charge-coupled device (CCD) is provided with a dopant implant gradient, lateral channel stops and blocking implants by means of a focused ion beam (FIB). The FIB is repeatedly scanned across each cell of the CCD as a succession of overlapping but discrete implant scans. The doping levels of the FIB implants accumulate to a stepwise approximation of a desired dopant density profile, the widths of the steps being no greater than about half the widths of the discrete FIB implants. With a FIB pixel of about 750-1,500 Angstroms, the widths of the steps are preferably about 250-500 Angstroms; the dimension of the cells in the dopant gradient direction can be made less than about 5 microns. The lateral channel stops and back blocking implants can be as narrow as single FIB pixel widths, thus freeing up more of the cell for charge carrying capacity.

15 Claims, 4 Drawing Sheets

DISTANCE ALONG CHANNEL

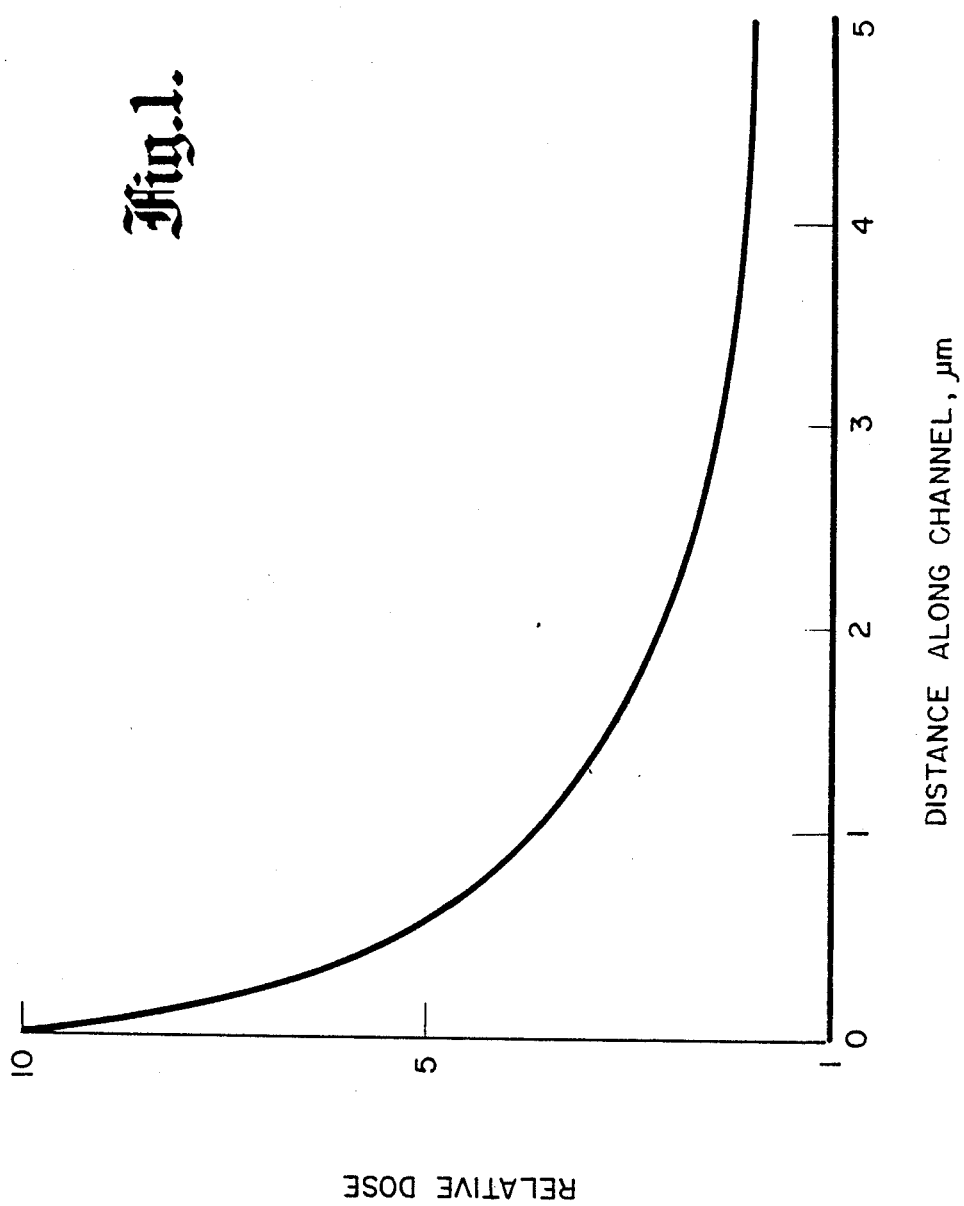

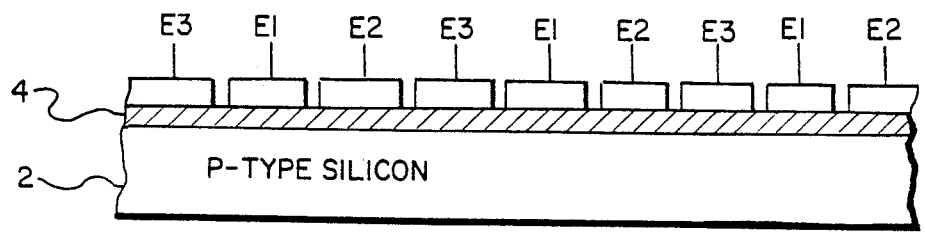
Fig.2.a.
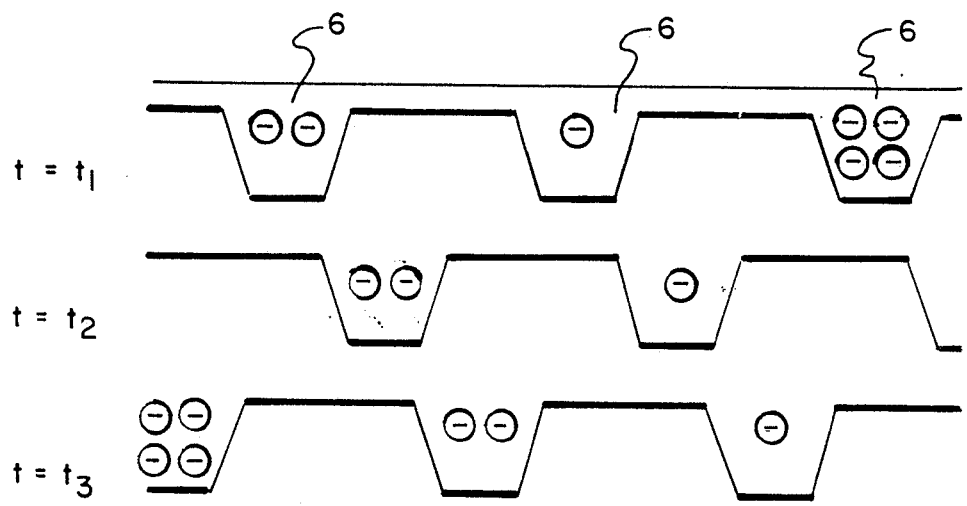
Fig.2.b.
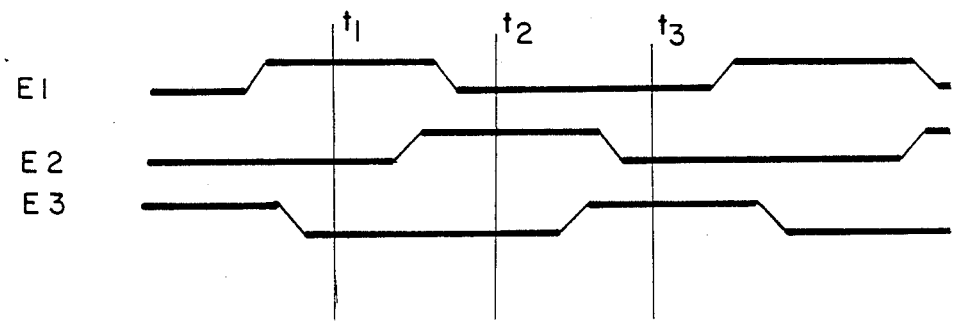
Fig.2.c.

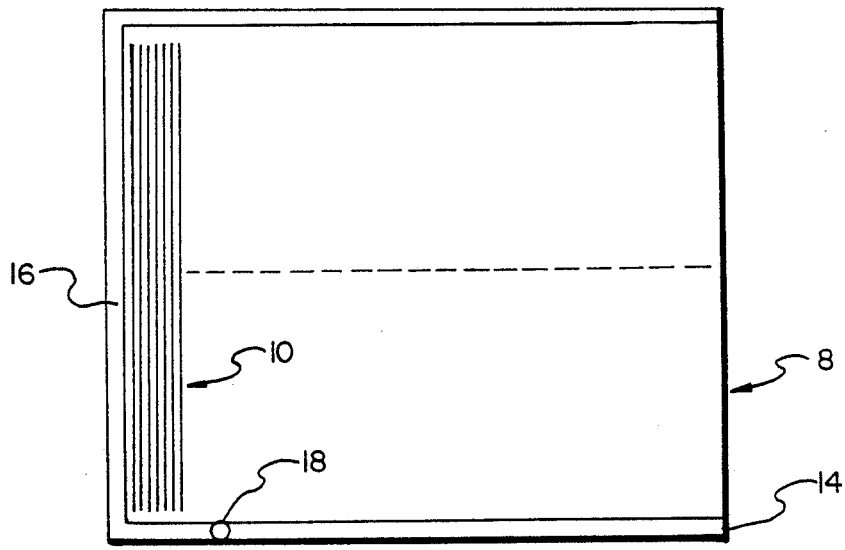
Fig. 3.
Fig. 4.a.
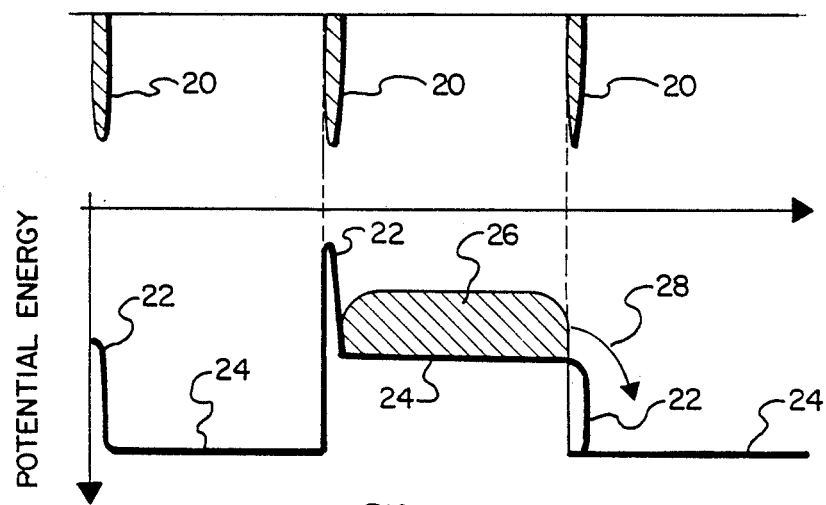
Fig. 4.b.

CHARGE-COUPLED DEVICE WITH FOCUSED ION BEAM FABRICATION

GOVERNMENT RIGHTS

The U.S. Government has certain rights in this invention under Contract No. 85M-0611.

This application is a continuation of application Ser. No. 046,019, filed May 5, 1987, now abandoned.

Background of the Invention

1. Field of the Invention

This invention relates to charge-coupled devices (CCDs), and particularly to CCDs having cells with graded doping implants, lateral channel stops and a blocking implant to control the direction of charge flow.

2. Description of the Related Art

CCDs are semiconductor devices in which minority charge is stored in spatially defined depletion regions (potential wells) of the semiconductor, and moved along the semiconductor by transferring the charge to similar adjacent wells. The formation of the potential wells is controlled by the manipulation of clocking voltage signals applied to surface electrodes and dependent also on the impurity dopant concentration of the material below the electrode. Since a potential well represents a non-equilibrium state, it will fill with minority charge from normal thermal generation. Thus, a CCD is normally continuously clocked or refreshed to maintain its functionality.

The potential wells are generally strung together as shift registers. Charge is injected or generated at various input ports, and then transferred to an output detector. By appropriate design to minimize the dispersive effects associated with the charge transfer process, well-defined charge packets can be moved over relatively long distances through thousands of transfers.

Several methods are available for controlling the charge motion, all of which rely upon the provision of a lower potential for the charge in the desired direction. When an electrode is placed in close proximity to the surface of the semiconductor substrate, the electrode's potential can control the near-surface potential within the semiconductor in a manner analogous to the metal oxide semiconductor (MOS) transistor action. If closely spaced electrodes are at different voltage levels they will form potential wells of different depths, and free charge will move from the regions of higher potential to those of lower potential. By alternating the voltages on the various electrodes in a proper sequence, a charge packet can be moved in a desired direction.

Attempts have been made to emulate a graded dopant implant dose in the cells of a CCD to produce an internal field that aids in the transfer of charge from one cell to another, thereby increasing transfer speed. The charge transfer will depend in general on three mechanisms: (1) mutual charge repulsion in the first stages of the transfer; (2) fringe fields from the attracting gate to which a clock signal is applied; and (3) thermal diffusion of charge that accompanies the transfer of the "last remnant" of the stored charge. Thermal diffusion is often the speed limiting mechanism in a CCD, in which high charge transfer efficiency is required. The purpose of varying the dopant dosage in the CCD cells is to produce a field to assist the thermal diffusion charge transfer, increase the CCD speed, and ensure that charge flows in the desired direction.

Approximations of dopant gradients within the CCD cells have previously been implemented with mask techniques. In this approach, a flood ion beam is applied to the CCD cells, while portions of the cells are masked so that the beam implants dopant ions only into the unmasked sections of the cells. This mask is then removed, and a new mask inserted and aligned to a wafer feature, to expose adjacent sections of the cells; the flood beam is again applied, but with a different ion density. Successive portions of the cells are thus implanted with doping ions, with the dopant density of each implant determined by the intensity of the flood beam and/or the implant duration. In this manner a very rough approximation of a smoothly varying dopant profile is achieved. However, because of difficulties in accurately aligning the masks with the underlying CCD substrate, it has heretofore been feasible to perform only three or four separate doping steps per cell. Available masks can only be aligned to about 0.5-1.0 micrometer tolerance, and each exposure step requires a separate mask alignment. Furthermore, alignment errors can accumulate from cell to cell. This has imposed a practical lower limit of about $5 \times 10$ micrometers for the cell dimensions. An additional and serious problem with the mask technique is that of low yields. CCD arrays can be as large as $10,000 \times 10,000$ cells, and a single bad cell may render the entire array unusable. Because of errors associated with the mask technique, the yield rate of CCDs has been undesirably low.

It has been suggested that a focused ion beam (FIB) might be used to implement a varying dopant profile for the CCD cells. A FIB column produces a very small, welldefined ion "spot" which may be traversed over a substrate to implant ions into the substrate. The doping produced with a FIB is determined by the type of dopant ions used. The ion implant density is controlled by the ion current density in the beam and the dwell time on the substrate, while the depth of implant is controlled by the beam voltage (energy). Accurately defined areas of a substrate can be implanted by scanning the beam over successive adjacent lines to fill the area. A representative ion beam column is disclosed in V. Wang, J. W. Ward and R. L. Seliger, "A Mass Separating Focused Ion Beam System For Maskless Ion Implantation", *Journal of Vacuum Science and Technology*, Nov.-Dec. 1981, pages 1158-63.

A one-dimensional modeling study has been conducted by D. Schroeder of Arizona State University for a five micrometer gate length surface channel CCD. For purposes of the study, it was assumed that a smoothly varying dopant density profile could be achieved within the CCD cells by means of a FIB. The study arrived at the doping profile illustrated in FIG. 1 as an example for producing an electric field to aid the transfer of charge to the adjacent CCD cell, so that the time required to achieve a given transfer efficiency is decreased. The model predicted an increase in CCD clock frequency better than five-fold, from 6 to 32 MHz, for a transfer inefficiency of $10^{-5}$ (all but one of $10^5$ electrons successfully transferred). An even greater improvement was predicted for buried channel CCDs. The predicted transfer speed also increased for a three micron CCL, but with a lesser relative change (an increase in clock frequency from 40 to 106 MHz for the surface channel device). This was assumed to result from the fringing field being larger due to the reduced distance between cells and gates, and the lesser importance of the limiting diffusion charge transfer mechanism.

While the use of a FIB offers considerable potential advantages for the fabrication of large scale CCDs, there is a need for a practical implementation of a FIB approach to this area. The idealized, smooth curve of FIG. 1 may be approached more closely using FIB technology than the mask fabrication technique described above. Using the FIB, the curve is approximated by stepping adjacent beam scans by an incremental distance in the gradient direction. The degree to which the ideal curve is realized depends upon the FIB spot (a 750-1,500 A spotsize defined at the half maximum intensity of the quasi-gaussian current intensity profile is typical in presently operating focusing columns) and the spacing of adjacent FIB scans. This latter value depends on the pointing accuracy of the beam as determined by the system electronics and is typically less than 500 angstroms. FIB spot sizes may be considerably reduced by future developments.

To prevent loss of charge in either a lateral or a reverse direction (with respect to the desired direction of charge flow from one cell to another), lateral channel stops and back blocking implants have previously been used in CCD cells. A back blocking implant is disclosed in Krambeck et al., U.S. Pat. No. 3,789,267, while a two-dimensional CCD array with barriers of different heights to control the direction of charge flow is disclosed in Krambeck et al., U.S. Pat. No. 4,051,505; both patents are assigned to Bell Telephone Laboratories, Inc. The lateral channel stops and back blocking implants are implanted to a depth on the order of the channel depth, and are doped opposite to the conductivity of the cell. Because of the limitations of mask resolution, and also because it has been felt that relatively thick stops and blocking implants were required, these implants were typically formed with a width on the order of 0.75 microns. However, the implants take up an appreciable amount of cell space, thereby reducing the charge capacity of the individual cells, and thus degrading the signal/noise ratio.

SUMMARY OF THE INVENTION

In view of the above problems and limitations, one purpose of this invention is to provide a CCD array in which the individual cells have high resolution dopant gradients that approximate a smooth curve. Another purpose is to provide the CCD cells with lateral channel stops and back blocking implants that take up less cell space and have less interference with the signal/noise ratio than previous CCDs. A significant increase in yield is another important purpose.

The cells of the CCD are provided with a varying doping profile by moving a FIB in successive scans across the cell, with each scan overlapping the previous scan by at least 50%. The doping level for each scan is varied to produce a stepwise approximation of a desired dopant density profile, in which the widths of the various steps are no greater than about half the widths of the discrete FIB scans. Since only an initial alignment of the FIB with respect to the cells is required, and the high accuracy of the FIB equipment, the CCD yield is substantially greater than with the prior mask technique. With a FIB spot size in the range of about 750-1,500 Angstroms, the widths of the steps are preferably in the approximate range of 250-500 Angstroms. Cells with a dimension of less than five microns in the direction of the doping gradient are readily obtainable.

Lateral channel stops and blocking implants are formed with FIB implants that may be as narrow as single FIB pixel widths, again in the approximate range of 750-1,500 Angstroms with presently available FIB columns. It has been discovered that charge barriers with small dimensions will still effectively block undesired charge flows, while at the same time leaving the cells with more usable area and a correspondingly greater charge capacity.

These and other features and advantages of the invention will be apparent to those skilled in the art from the following detailed description of a preferred embodiment, taken together with the accompanying drawings, in which:

DESCRIPTION OF THE DRAWINGS

FIG. 1 is a diagram of a computer modeled doping density profile for a CCD cell, discussed above;

FIGS. 2a, 2b and 2c are respectively a sectional view of a CCD channel, a diagram of CCD surface potential profiles for three different clock time intervals, and a diagram of the voltage waveforms for the three phase clocks;

FIG. 3 is a plan view of an individual CCD cell illustrating the FIB scanning employed to produce a varying dopant density profile, and both channel stops and a blocking implant formed with a FIB in accordance with the invention;

FIGS. 4a and 4b are respectively diagrams of blocking implants formed with a FIB in CCD cells, and a corresponding potential energy diagram.

DETAILED DESCRIPTION OF A PREFERRED EMBODIMENT

Figure 5:
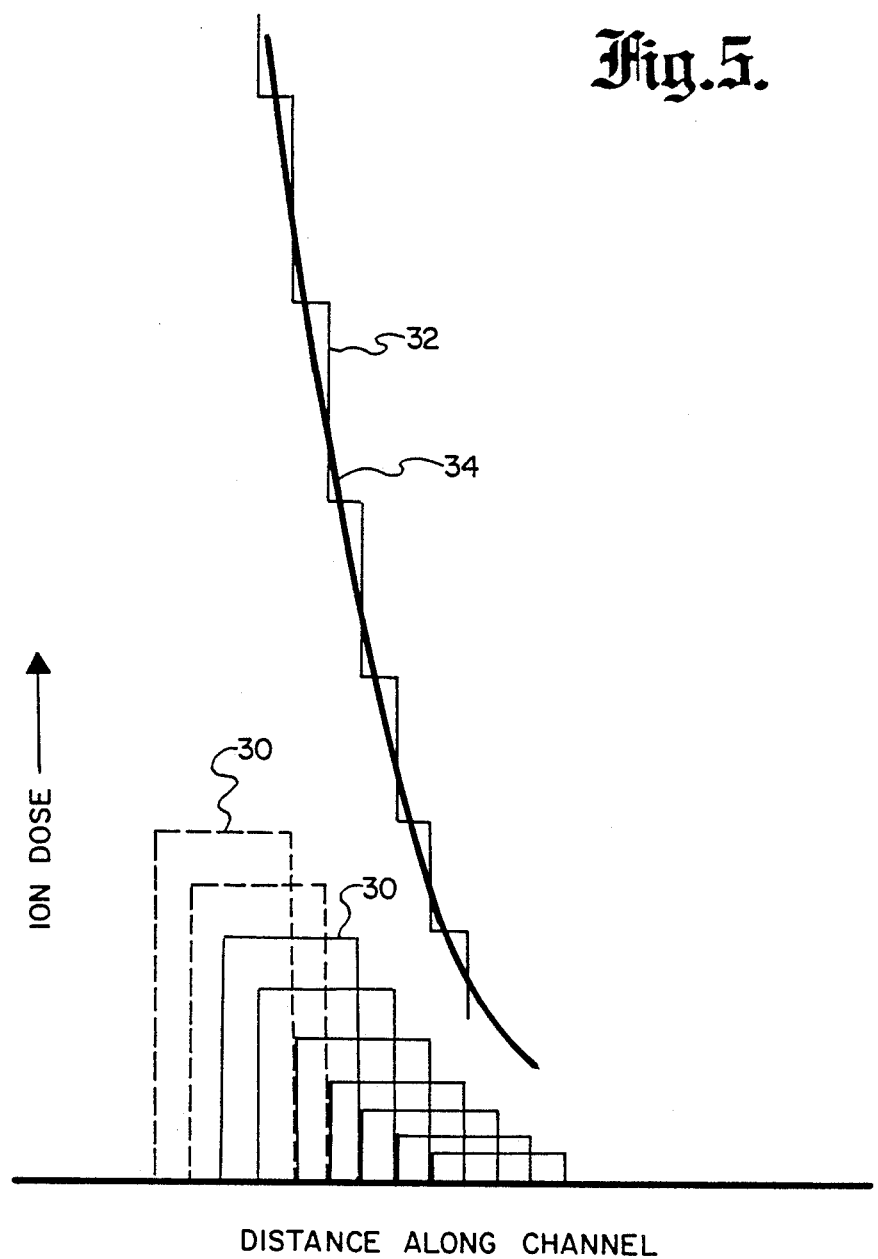
FIG. 5 is a diagram illustrating the stepwise doping density profile achieved with the present invention for a CCD cell.

FIGS. 2a-2c illustrate the basic charge transfer mechanism for a surface channel CCD to which the invention is applicable. Referring first to FIG. 2a, a semiconductor substrate 2 such as p-type silicon provides the base for the CCD. A thin layer of insulative material 4, generally silicon dioxide, overlies the semiconductor substrate. A series of electrodes are provided on top of the insulator layer and are divided into groups of three, with the three electrodes of each group designated E1, E2 and E3, respectively. Although only a one-dimensional, linear register is illustrated, in practice the CCD would normally comprise a two-dimensional array of electrodes formed into a large number of parallel registers. The portion of the silicon substrate below each electrode comprises a cell which receives and transmits a charge in accordance with the voltage patterns applied to the various electrodes.

FIG. 2b illustrates the profile of the surface potential in each cell for three different clock time intervals t1, t2 and t3, while FIG. 2c illustrates the voltage status of the electrodes E1, E2 and E3 at the same three time intervals t1, t2 and t3. At t1 it is assumed that positive voltages are applied to each of the E1 electrodes, and zero voltages to each of the E2 and E3 electrodes. This produces a negative charge packet 6 in the cells immediately below the E1 electrodes, the magnitude of the charge being determined by the amount of voltage applied to each E1 electrode. The charge packets are then shifted from cell to cell by cycling the electrode voltage sequentially from E1 to E2 to E3. In this manner a two-dimensional CCD array can rapidly process a large volume of information.

A single cell 8 is illustrated in FIG. 3. Dopant implants are introduced into the substrate, in accordance with the invention, with the use of a FIB. A varying dopant density (preferably approximating that illustrated in FIG. 1), lateral channel stops and a back blocking implant are all formed with the FIB. The doping gradient is established by scanning the FIB repeatedly across the cell, and incrementing the FIB transverse to the scanning direction for each successive scan. The centers of the successive scans are indicated by parallel lines 10. In actual practice the center lines for successive scans would be separated from each other by less than about half the FIB spot (pixel) size. Thus, each scan will overlap the immediately adjacent scans, and also scans further removed if the distance between scans is sufficiently less than the FIB pixel size.

The ion density (current) for each successive scan can be automatically adjusted in a predetermined manner with available FIB columns, thereby permitting a doping density gradient to be introduced during the progress of successive scans. Thus, each point in the cell (inward from the fringes) will be included in at least two scans. The doping density at that point will be the sum of the dopings from all of the scans which encompass the point. Although scan center lines are shown only on the left hand side of the cell, it should be understood that the scanning is continued until substantially the entire cell has been processed.

Lateral channel stops 12, 14 and a back blocking implant 16 are also formed with the FIB. These elements are narrow, generally less than 0.5 microns wide. As shown, they may be formed with single FIB scans, so that their widths are restricted to a single FIB pixel width; the FIB pixel at the substrate surface is illustrated by circle 18. It is desired that these elements be as narrow as possible. In prior practice, the minimum width was determined by mask resolution and mask alignment accuracy. Using a FIB, these implants may be formed by a single FIB scan, so the width is that of the FIB; the FIB pixel at the substrate surface is indicated by circle 18. It has been discovered that these blocking elements will perform well with the FIB fabrication technique even when they are restricted to single FIB pixel widths in the order of 750-1,500 Angstroms. As a further advantage, the blocking implant permits the CCD to operate with two-phase clocks thereby reducing the number of cells per clockcycle from 3 to 2.

A cross-sectional view of back blocking implants 20 for three successive cells is illustrated in FIG. 4a; a profile of the lateral channel stops would have a similar appearance. The FIB voltage (energy) is controlled so that the blocking implants and lateral channel stops are formed sufficiently deep in the semiconductor substrate to effectively block undesired flows of charge—the blocking implants can be more shallow with surface channel CCDs than with buried channel devices. The blocking implants and channel stops have a conductivity opposite to that of the cell. For an p-type buried channel device, the channel stops could be formed with phosphorous ions at a density in the order of $10^{14}$ ions/cm$^2$, while the back blocking implant could be formed with either phosphorous or arsenic ions at a density in the order of $10^{13}$ ions/cm$^2$. The narrow widths of the blocking elements free up more cell space for charge-carrying capacity than was previously attainable, thereby increasing the signal/noise ratio.

FIG. 4b is a potential energy diagram illustrating the effect of the back blocking implants 20 in ensuring a charge flow in the desired direction. Each implant creates a potential energy spike 22 above the potential energy level 24 of its associated cell. Strobing a particular cell with its corresponding electrode elevates the potential energy floor of the cell and produces a charge packet 26. This charge packet can flow to an adjacent cell which has a lower potential energy floor, as indicated by arrow 28. The blocking implant 22 prevents the packet from flowing to the other adjacent cell, which also has a lower potential energy floor. In a similar manner, charge is prevented from laterally diffusing out of the cell by the lateral channel stops.

A portion of the cell doping density gradient is illustrated in exaggerated form in FIG. 5. The ion implants from each successive FIB scan are indicated by bars 30, with the first two bars shown in dashed lines. Although rectangular bars are illustrated for simplicity, in practice the dopant density profile for each implant would follow more of a Gaussian shape. In the example shown, each successive scan is incremented by one-fourth the FIB pixel width, thereby causing each to be included within four separate scans (except at the fringes). The total ion dose at each such point is thus the total dosage resulting from the four separate scans.

The result is a stepwise doping profile 32, with each step being only as wide as the incremental distance between each successive FIB scan. In other words, if the FIB pixel is 1,000 Angstroms wide and the FIB is incremented by 250 Angstroms for each successive scan, the total dosage steps will be 250 Angstroms wide. This represents an improvement in resolution on the order of thirty times, compared to the prior mask fabrication techniques. The stepwise dopant profile is a useful approximation to an ideal smooth gradient curve 34. The slope of the curve is established by the selection of doping levels for each successive FIB scan.

With attainable FIB pixel widths in the order of 1,000-1,500 Angstroms, the widths of the dopant profile steps are preferably in the order of 250-500 Angstroms. With this technique the cell dimension in the direction of the dopant gradient can be reduced to less than 5 microns, which was the approximate lower limit for mask fabrication, and can go below about 3 microns. Together with the fact that only an initial alignment of the FIB with respect to the semiconductor substrate is required, this makes it possible to achieve a very high density CCD with a faster operating frequency, higher signal/noise ratio and much greater yield than with prior mask techniques.

Although a particular embodiment of the invention has been shown and described, numerous variations and alternate embodiments will occur to those skilled in the art. Accordingly, it is intended that the invention be limited only in terms of the appended claims.

We claim:

1. In a charge-coupled device (CCD) comprising a semiconductor substrate and an array of electrodes having defined electrode lengths and widths for establishing a corresponding array of potential well cells having defined cell lengths and widths in the semiconductor substrate, and for moving charge packets among the cells in the direction of the cell lengths, the cells having respective dopant implant density gradients in the direction of their lengths, the improvement comprising the dopant implants being provided as lateral successions of overlapping but discrete focused ion beam (FIB) implants extending substantially across the cell widths, with each scan displaced from its preceding scan in the direction of the cell lengths, the doping levels of the FIB implants accumulating to a stepwise approximation of a desired dopant density profile having a plurality of steps, the widths of said steps in the direction of the cell lengths being no greater than about half the widths of the discrete FIB implants and no greater than about 750 Angstroms, and the widths of the discrete FIB implants being in the approximate range of 750–1,500 Angstroms.

2. The CCD of claim 1, wherein the widths of said steps are in the approximate range of 250–750 Angstroms.

3. In a charge-coupled device (CCD) comprising a semiconductor substrate and an array of electrodes having defined electrode lengths and widths for establishing a corresponding array of potential well cells having defined cell lengths and widths in the semiconductor substrate, and for moving charge packets among the cells in the direction of the cell lengths, the cells having respective dopant implant density gradients in the direction of their lengths, the improvement comprising the dopant implants being provided as lateral successions of overlapping but discrete focused ion beam (FIB) implants extending substantially across the cell widths, with each scan displaced from and overlapping its preceding scan in the direction of the cell lengths, the doping levels of the overlapping FIB implants accumulating to a stepwise approximation of a desired dopant density profile having a plurality of steps, the widths of said steps in the direction of the cell lengths being no greater than about half the widths of the discrete FIB implants and in the approximate range of 250–750 Angstroms.

4. The CCD of claim 3, wherein the cell lengths are less than about five microns.

5. The CCD of claim 4, wherein the dimension of the cells in the direction of the doping gradient is less than about three microns.

6. The CCD of claim 3, implemented as a buried channel CCD, said cells including lateral channel stops provided as FIB implants having predetermined widths in the direction of their cells widths and extending into the substrate to predetermined depths, the depths of said channel stops being substantially greater than their widths, said channel stops being less than 0.5 microns wide.

7. The CCD of claim 6, wherein said channel stops have substantially single FIB pixel widths in the approximate range of 750–1,500 Angstroms.

8. The CCD of claim 6, said cells including respective blocking implants provided as FIB implants between adjacent cells in the direction of charge packet movement, said blocking implants being positioned to block reverse charge flows from their respective cells.

9. The CCD of claim 3, implemented as a buried channel CCD, said cells including respective blocking implants provided as FIB implants between adjacent cells in the direction of charge packet movement, said blacking implants being positioned to block reverse charge flows from their respective cells, and having predetermined widths in the direction of the cell lengths and extending into the substrate to predetermined depths, the depths of said blocking implants being substantially greater than their widths and their widths being less than 0.5 microns.

10. The CCD of claim 9, wherein said blocking implants have substantially single FIB pixel widths in the approximate range of 750–1,500 Angstroms.

11. In a charge-coupled device (CCD) comprising a semiconductor substrate and an array of electrodes having defined electrode lengths and widths for establishing a corresponding array of potential well cells having defined cell lengths and widths in the semiconductor substrate, and for moving charge packets among the cells in the direction of the cell lengths, said cells including lateral channel stops for blocking lateral charge flows, the improvement comprising the provision of said lateral channel stops as focused ion beam (FIB) channel stop implants having predetermined widths in the direction of the cell widths and extending into the substrate to predetermined depths, the depths of said channel stop implants being substantially greater than their widths, said channel stop implants being less than 0.5 microns wide.

12. The CCD of claim 11, wherein the widths of said channel stop implants are in the approximate range of 750–1,500 Angstroms.

13. In a buried channel charge-coupled device (CCD) comprising a semiconductor substrate and an array of electrodes having defined electrode lengths and widths for establishing a corresponding array of potential well cells having defined cell lengths and widths in the semiconductor substrate, and for moving charge packets among the cells in the direction of the cell length, said cells including reflective blocking implants positioned to block reverse charge flows from their respective cells, the improvement comprising the provision of said blocking implants as focused ion beam (FIB) blocking implants having predetermined widths in the direction of the cell lengths and extending into the substrate to predetermined depths, said blocking implants having substantially vertical side walls aligned with the cell widths, the depths of said blocking implants being substantially greater than their widths.

14. The CCD of claim 13, wherein said blocking implants are less than 0.5 microns wide.

15. The CCD of claim 14, the widths of said blocking implants being in the approximate range of 750–1,500 Angstroms.

* * * * *